United States Patent
Moriyama

(10) Patent No.: US 12,152,168 B2
(45) Date of Patent: Nov. 26, 2024

(54) POLISHING SLURRY

(71) Applicant: NITTA DuPont Incorporated, Osaka (JP)

(72) Inventor: Kazuki Moriyama, Kyoto (JP)

(73) Assignee: NITTA DUPONT INCORPORATED, Osaka (JP)

( * ) Notice: Subject to any disclaimer, the term of this patent is extended or adjusted under 35 U.S.C. 154(b) by 194 days.

(21) Appl. No.: 17/788,374

(22) PCT Filed: Oct. 13, 2020

(86) PCT No.: PCT/JP2020/038656
§ 371 (c)(1),
(2) Date: Jun. 23, 2022

(87) PCT Pub. No.: WO2021/131247
PCT Pub. Date: Jul. 1, 2021

(65) Prior Publication Data
US 2023/0041937 A1 Feb. 9, 2023

(30) Foreign Application Priority Data

Dec. 27, 2019 (JP) ................................. 2019-238628

(51) Int. Cl.
*C09G 1/02* (2006.01)
(52) U.S. Cl.
CPC ..................................... *C09G 1/02* (2013.01)
(58) Field of Classification Search
CPC ................................... C09G 1/02; C09K 3/14
See application file for complete search history.

(56) References Cited

U.S. PATENT DOCUMENTS

| 5,693,239 | A | * | 12/1997 | Wang | C09K 3/1409 |
| | | | | | 216/102 |
| 5,972,863 | A | * | 10/1999 | Heo | C11D 7/20 |
| | | | | | 510/181 |
| 7,364,667 | B2 | * | 4/2008 | Minamihaba | C09K 3/1463 |
| | | | | | 106/3 |
| 2002/0023389 | A1 | | 2/2002 | Minamihaba et al. | |
| 2009/0111359 | A1 | | 4/2009 | Suzuki et al. | |

FOREIGN PATENT DOCUMENTS

| CN | 101423746 | 5/2009 |
| CN | 107001914 | 8/2017 |
| JP | 2001-342455 | 12/2001 |

(Continued)

OTHER PUBLICATIONS

Fisher, M.L., Colic, M., Rao, M. P. and Lange, F.F. (2001), Effect of Silica Nanoparticle Size on the Stability of Alumina/Silica Suspensions. Journal of the American Ceramic Society, 84: 713-718. https://doi.org/10.1111/j.1151-2916.2001.tb00731.x (Year: 2001).*

*Primary Examiner* — Alexandra M Moore
(74) *Attorney, Agent, or Firm* — Bauer & Joseph

(57) ABSTRACT

A polishing slurry according to the present invention is a polishing slurry for polishing a polishing object including a resin, wherein the polishing slurry includes alumina abrasives and silica abrasives, the silica abrasives include aggregate particles composed of a plurality of primary particles of colloidal silica, and an average particle size of the primary particles is smaller than a median size of the alumina abrasives.

2 Claims, 1 Drawing Sheet

(56) References Cited

FOREIGN PATENT DOCUMENTS

| | | |
|---|---|---|
| JP | 2002-141314 | 5/2002 |
| JP | 2008-098652 | 4/2008 |
| JP | 2009-163810 | 7/2009 |
| JP | 2009-176397 | 8/2009 |
| JP | 2009-218555 | 9/2009 |
| JP | 5459466 | 4/2014 |
| JP | 2018-199751 | 12/2018 |
| WO | 2017/002705 | 1/2017 |

\* cited by examiner

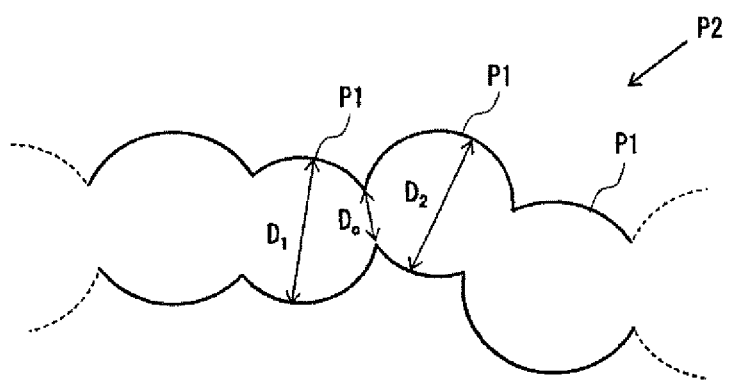

POLISHING SLURRY

CROSS-REFERENCE TO RELATED APPLICATION

This application claims priority to Japanese Patent Application No. 2019-238628, the disclosure of which is incorporated herein by reference in its entirety.

FIELD

The present invention relates to a polishing slurry.

BACKGROUND

Conventionally, a printed-circuit board manufactured in the following manner has been known. First, a groove pattern is formed on a resin sheet. Next, a copper layer is formed by layering copper or a copper alloy on the resin sheet so as to fill the groove pattern with the copper or the copper alloy. Then, the copper alloy excessively layered on a resin layer formed by the resin sheet is removed by chemical mechanical polishing (CMP), to thereby obtain a printed-circuit board with the groove pattern filled with copper or the copper alloy. As such a polishing slurry used for polishing a polishing object including a resin, for example, a polishing slurry including silica abrasives is known (e.g., Patent Literature 1).

CITATION LIST

Patent Literature

Patent Literature 1: JP 5459466 B

SUMMARY OF THE INVENTION

Technical Problem

Meanwhile, a high removal rate can be demanded in terms of efficiency of polishing in the polishing such as CMP. However, sufficient study has not been made on a polishing shiny that enables to effectively polish a polishing object including resin at a high removal rate.

It is an object of the present invention to provide a polishing slurry that enables polishing at a high removal rate when a polishing object including a resin is polished.

Solution to Problem

As a result of diligent studies, the present inventors have found that the polishing slurry that includes silica abrasives including aggregate particles composed of a plurality of primary particles of colloidal silica and further includes alumina abrasives having such a size as to fulfill a certain relation with the primary particles can improve the removal rate on a polishing object including a resin. Consequently, the present inventors have arrived at the present invention.

That is, the polishing slurry according to the present invention is a polishing slurry for polishing a polishing object including a resin, the polishing slurry including alumina abrasives and silica abrasives, in which the silica abrasives include aggregate particles composed of a plurality of primary particles of colloidal silica, and an average particle size of the primary particles is smaller than a median size of the alumina abrasives.

BRIEF DESCRIPTION OF DRAWINGS

FIG. 1 is a schematic view showing an appearance of aggregate particles included in silica abrasives.

DETAILED DESCRIPTION OF THE PREFERRED EMBODIMENT

An embodiment of the present invention will be hereinafter described.

A polishing slurry according to this embodiment is a polishing slurry for polishing a polishing object including a resin. The polishing object in this embodiment can be a printed-circuit board, a module board, a package substrate, etc. That is, a polishing surface of the polishing object of this embodiment to be polished by the polishing slurry can be formed only by a resin or formed by a resin and a metal.

Hereinafter, a description will be given by taking, for example, the polishing slurry used for polishing a polishing object having a polishing surface including a metal region that is formed by copper or a copper alloy and a resin region that is formed by a resin and is adjacent to the metal region.

The polishing object includes a resin layer, a groove formed in the resin layer, and the groove filled with copper or the copper alloy. The polishing object can be obtained by forming a groove on the resin sheet using a laser beam to form a groove pattern and plating the groove with copper or the copper alloy. The polishing slurry according to this embodiment is used for polishing the polishing object having a polishing surface to which excess copper or a copper alloy is adhered, to bring the polishing surface into a flat state. Examples of a material to form the resin sheet include an epoxy resin and a polyimide resin. Examples of the material also include a mixture of the resin and an inorganic filler such as a silica filler. Examples of the mixture of the resin and the silica filler include a mixture including 5 to 95 mass % of the resin and 5 to 95 mass % of the silica filler. The polishing object to be polished by the polishing slurry of this embodiment can be a resin sheet formed only by the aforementioned material before it is irradiated with the laser beam.

Also, the polishing slurry according to this embodiment includes alumina abrasives and silica abrasives. The silica abrasives includes aggregate particles composed of a plurality of primary particles of colloidal silica, and has an average particle size of the primary particles being smaller than a median size of the alumina abrasives.

The polishing slurry of this embodiment includes water that serves as the dispersion medium of abrasives. The polishing slurry of this embodiment includes a pH adjuster (alkali, organic acid), a surfactant, and a defoamer.

Alumina is hard and excellent in grinding force compared with silica. It is presumed that, in the polishing slurry according to this embodiment, the aggregate particles of colloidal silica suppress the alumina abrasives from rolling on the polishing surface to thereby cause the excellent grinding force of alumina abrasives. In order to produce such an effect, the aggregate particles included in the silica abrasives are preferably in a rosary-like form, as shown in FIG. 1. FIG. 1 shows aggregate particles P2 in which a plurality of primary particles P1 are connected to each other to have a rosary-like form as a whole. In the polishing using the polishing slurry of this embodiment, the aggregate particles P2 as aforementioned collapse into smaller aggregate particles so that a large number of aggregate particles that work on preventing the rolling of alumina abrasives can be formed. However, when the aggregate particles P2 collapse into the primary particles P1, the function of preventing the rolling of alumina abrasives is decreased.

The length Dc of the region between two primary particles P1 connected with each other in the aggregate particles P2 is preferably shorter than the diameters (D1, D2) of the two primary particles P1, but is preferably equal to the diameters (D1, D2) or a certain length more than the diameters (D1, D2). The aggregate particles P1 preferably include two different primary particles in which the length (Dc) of each connected region satisfies formulae (1) and (2) below.

$$(0.01 \times D1) < Dc < (0.9 \times D1) \quad (1)$$

$$(0.01 \times D2) < Dc < (0.9 \times D2) \quad (2)$$

A median size of the silica abrasives is preferably 100 nm or more. The median size of the silica abrasives is more preferably 105 nm or more, still more preferably 110 nm or more. The median size of the silica abrasives is preferably 200 nm or less, more preferably 180 nm or less, still more preferably 150 nm or less.

An average particle size of the primary particles of the silica abrasives is preferably 30 nm or more, more preferably 40 nm or more, still more preferably 50 nm or more. The average particle size of the primary particles of the silica abrasives is preferably 100 nm or less, more preferably 90 nm or less, still more preferably 80 nm or less.

The alumina abrasives is not necessarily included in the fatal of a single particle, and aggregate particles can be included. The alumina abrasives can be particles formed by α-alumina, particles formed by γ-alumina, or particles formed by θ-alumina. In the polishing slurry according to this embodiment, the alumina abrasives preferably include particles formed by α-alumina. A median size of the alumina abrasives is preferably 300 nm or less. The median size of the alumina abrasives is more preferably 280 nm or less, still more preferably 250 nm or less. The median size of the alumina abrasives is preferably 100 nm or more, more preferably 120 nm or more, still more preferably 150 nm or more.

The average particle size of the primary particles of the silica abrasives is smaller than the median size of the alumina abrasives. It is preferable that the average particle size of the primary particles of the silica abrasives be less than 50% of the median size of the alumina abrasives.

The median size of the alumina abrasives can be measured in the following manner. That is, using the zeta-potential & particle size measurement system ELSZ-2 (manufactured by Otsuka Electronics Co., Ltd.), a volume particle size distribution is determined by a dynamic light scattering method. Then, the particle size, at which the cumulative volume frequency in the obtained volume particle size distribution is 50%, is taken as the median size of the alumina abrasives. The measurement is performed by filling a measurement cell with the alumina abrasives that are diluted to 100 times by ultrapure water. A semiconductor laser is used as the laser. The median size of the silica abrasives can be also measured in the same manner as that for the median size of the alumina abrasives.

The average particle size of the primary particles of the silica abrasives can be measured in the following manner. That is, the average particle size of the primary particles of the silica abrasives is calculated by formula (3) below on the presumption that the primary particles of the silica abrasives each are in the form of a perfect spherical shape. In formula (3) below, the density of the silica abrasives is 2.2 g/cm³.

$$d = 6/\rho S \quad (3)$$

d: particle size of primary particles (µm)
ρ: density of silica abrasives (g/cm³)
S: specific surface area (m²/g)

The specific surface area in formula (3) above is measured using the specific surface area & pore size analyzer QUADRASORB evo (manufactured by Quantachrome Co.) according to JIS Z8830:2013 (Determination of the specific surface area of powders (solids) by gas absorption BET method). Detailed conditions are shown below.

Pre-treatment: silica abrasives are placed in the measurement cell, followed by
vacuum deaeration at 85° C. for 2 hours.
Measurement principle: constant volume method
Absorption gas: nitrogen gas
Measured temperature: 77.35 K (−195.8° C.)
Cell size: small cell: 1.5 cm³ (stem outer diameter: 9 mm)
Measured item: several points on the absorption side at $P/P_0 = 0$ to 0.3
Analyzed item: specific surface area by a BET multipoint method The measurement was made twice by the aforementioned method for the same silica abrasives to determine the specific surface areas, and then calculate the average value of the particle size of the primary particles from the specific surface areas according to formula (3) above. The average value of the particle size of the primary particles obtained as above serves as the average particle size of the primary particles.

In the polishing slurry according to this embodiment, a concentration of the abrasives including the alumina abrasives and the silica abrasives is preferably 1 to 20 mass %, more preferably 2 to 15 mass %. The polishing slurry according to this embodiment having a concentration of the abrasives of 20 mass % or less can suppress the occurrence of scratches. Also, the polishing slurry according to this embodiment having a concentration of the abrasives of 1 mass % or more can increase the removal rate.

In the polishing slurry according to this embodiment, the concentration of the alumina abrasives is preferably 0.1 to 10 mass %, more preferably 1 to 5 mass %.

The polishing slurry according to this embodiment preferably include a smaller amount of the alumina abrasives than that of the silica abrasives. In the polishing slurry according to this embodiment, the mass ratio of the concentration of the alumina abrasives to the concentration of the silica abrasives (i.e., the concentration of the alumina abrasives/the concentration of the silica abrasives) is preferably 0.1 to 1, more preferably 0.2 to 0.9.

In the polishing slurry according to this embodiment, the pH is preferably 7.0 to 12.0, more preferably 8.0 to 11.0. Further, a pH adjustor is included in the polishing slurry according to this embodiment so that the pH falls in the aforementioned range.

Examples of the alkali which is a pH adjustor include ammonia, sodium hydroxide, and potassium hydroxide. As the alkali, potassium hydroxide is preferable. The alkali preferably includes 80 to 100 mass % of potassium hydroxide, more preferably 90 to 100 mass %, still more preferably 100 mass %. The polishing slurry preferably includes 0.01 to 1 mass % of the alkali.

Examples of the organic acid which is a pH adjustor include amino acid and carboxylic acid. Examples of the amino acid include glycine, glutamic acid, and aspartic acid.

Examples of the carboxylic acid include formic acid, acetic acid, propionic acid, butyric acid, oxalic acid, malonic acid, succinic acid, benzoic acid, phthalic acid, salicylic acid, tartaric acid, citric acid, gluconic acid, glyoxylic acid, and malic acid. The organic acid preferably includes 80 to 100 mass % of glycine, more preferably 90 to 100 mass %, still more preferably 100 mass %. The polishing slurry preferably includes 0.01 to 1 mass % of the organic acid.

Examples of the surfactant include alkylbenzenesulfonic acid and salts thereof. Examples of the alkylbenzenesulfonic acid include dodecylbenzene sulfonic acid, decylbenzene sulfonic acid, undecylbenzene sulfonic acid, tridecylbenzene sulfonic acid, and tetrabenzene sulfonic acid. Examples of alkylbenzenesulfonate include sodium alkylbenzenesulfonate and alkylbenzenesulfonic acid neutralized with triethanolamine (TEA) (i.e., alkylbenzenesulfonate triethanolamine). The polishing slurry preferably includes 0.01 to 2 mass % of the surfactant.

Examples of the defoamer include silicone oil and silicone oil emulsion. The polishing slurry preferably includes 0.01 to 1 mass % of the defoamer.

The polishing slurry according to this embodiment is configured as described above and thus has the following advantages.

The polishing slurry according to this embodiment is a polishing slurry for polishing a polishing object including a resin. The polishing slurry according to this embodiment includes alumina abrasives and silica abrasives. The silica abrasives include aggregate particles composed of a plurality of primary particles of colloidal silica. The average particle size of the primary particles is smaller than a median size of the alumina abrasives.

Alumina is hard and excellent in grinding force compared with silica. Thus, the polishing slurry including the alumina abrasives thereby makes it possible to improve the removal rate. Further, the polishing slurry including aggregate particles composed of a plurality of primary particles of colloidal silica makes it possible to easily restrict the alumina abrasives from rolling by the aggregate particles of colloidal silica, which results in facilitating exertion of the excellent grinding force of the alumina abrasives. Moreover, according to the polishing slurry in which the average particle size of the primary particles is smaller than the median size of the alumina abrasives, it is possible to more easily allow the aggregate particles to restrict the rolling of the alumina abrasives. Therefore, the polishing slurry according to this embodiment can improve the removal rate in polishing of the polishing object including a resin.

Fumed silica has a larger number of edge portions than colloidal silica and thus tends to cause the scratches on the polishing object. Thus, the polishing slurry in which the aggregate particles are formed by colloidal silica does not easily cause the scratches on the polishing object compared with the case where the aggregate particles are formed by fumed silica.

The polishing slurry according to the present invention is not limited to the configuration of the aforementioned embodiment. Further, the polishing slurry according to the present invention is not limited to those having the aforementioned operational effects. Various modifications can be made to the polishing slurry according to the present invention without departing from the gist of the present invention.

The polishing slurry according to the present invention can be used in the following polishing method. That is, the method includes a step of polishing the polishing object including a resin using the polishing slurry, in which the polishing slurry includes alumina abrasives and silica abrasives, the silica abrasives include aggregate particles composed of a plurality of primary particles of colloidal silica, and an average particle size of the primary particles is smaller than a median size of the alumina abrasives.

EXAMPLES

Next, the present invention will be further specifically described with reference to Examples and Comparative Examples.

Examples and Comparative Examples

The polishing slurry of each of Examples and Comparative Examples with the compositions showing in Tables 1 and 2 below was prepared. The alumina abrasives used herein were alumina abrasives having a median size of 200 nm, and including aggregate particles, in which a plurality of primary particles of α-alumina are aggregated. The silica abrasives used herein were silica abrasives and colloidal silica, the silica abrasives including aggregate particles, in which a plurality of primary particles of colloidal silica are connected to have a rosary-like form and having a median size of 130 nm (hereinafter also referred to as "Silica 1"), and the colloidal silica not being aggregate particles and having a median size of 130 nm (hereinafter also referred to as "Silica 2"). The organic acid used herein was glycine. The alkali used herein was potassium hydroxide. The alkylbenzenesulfonate used herein was linear dodecylbenzene sulfonate triethanolamine (hereinafter also simply referred to as "LAS"). The defoamer used herein was a silicone emulsion. The BET specific surface area of Silica 1 was 44.8 $m^2/g$, and the average particle size of the primary particles of colloidal silica in Silica 1 was 60.9 nm in terms of the BET specific surface area.

<Removal Rate (RR) Test>

Using the polishing slurry of each of Examples and Comparative Examples, a polishing object was polished in the following conditions to determine a removal rate.

Polishing object: a silicon wafer coated with a film of a polyimide resin
Polishing machine: product name "SH-24" manufactured by Speedfam Company Limited
Polishing pressure: 3 psi
Slurry flow rate: 150 mL/min
Number of revolutions of platen/number of revolutions of head: 90 rpm 89 rpm
Polishing time: 1 min
Polishing pad: product name "IC1400" manufactured by Nitta Haas Incorporated (currently, NITTA DuPont Incorporated)

<Removal Rate>

A removal rate was obtained by dividing the thickness decreased by the polishing by the polishing time. The thickness was measured by nanospecAFT5100 manufactured by Nano-metrics Incorporated.

<pH of Polishing Slurry>

The pH of the polishing slurry was measured using a pH meter.

Test results are shown in Tables 1 and 2 below.

TABLE 1

| | | | Ex. 1 | Ex. 2 | Ex. 3 | Ex. 4 | Ex. 5 | Ex. 6 |
|---|---|---|---|---|---|---|---|---|
| Composition of polishing slurry (mass %) | Abrasives | Alumina | 2.0 | 2.0 | 2.0 | 2.0 | 2.0 | 2.0 |
| | | Silica 1 (rosary-like form) | 1.0 | 2.5 | 5.0 | 7.5 | 10.0 | 2.0 |
| | | Silica 2 (nonaggregated) | — | — | — | — | — | — |
| | Surfactant | LAS | 1.5 | — | — | — | — | 1.0 |
| | pH adjuster | KOH | 0.1 | 0.1 | 0.1 | 0.1 | 0.1 | 0.1 |
| | | Glycine | 0.15 | — | 0.15 | 0.15 | 0.15 | 0.15 |
| | Defoamer | Silicone | 0.1 | — | — | 0.1 | 0.1 | 0.1 |
| | Water | | Residue | Residue | Residue | Residue | Residue | Residue |
| Removal rate (nm/min) | | | 2687 | 2917 | 3148 | 3146 | 2935 | 3062 |
| pH of polishing slurry | | | 9.7 | 9.7 | 9.9 | 10.1 | 10.2 | 9.7 |

TABLE 2

| | | | C. Ex. 1 | C. Ex. 2 | C. Ex. 3 | C. Ex. 4 | C. Ex. 5 | C. Ex. 6 | C. Ex. 7 | C. Ex. 8 | C. Ex. 9 | C. Ex. 10 |
|---|---|---|---|---|---|---|---|---|---|---|---|---|
| Composition of polishing slurry (mass %) | Abrasives | Alumina | — | 2.0 | 7.0 | 12.0 | — | — | — | — | — | 2.0 |
| | | Silica 1 (rosary-like form) | 5.0 | — | — | — | 7.0 | 12.0 | — | — | — | — |
| | | Silica 2 (nonaggregated) | — | — | — | — | — | — | 5.0 | 7.0 | 12.0 | 5.0 |
| | Surfactant | LAS | 0.5 | 1.0 | 1.0 | 1.0 | 1.0 | 1.0 | 1.0 | 1.0 | 1.0 | 1.0 |
| | pH adjuster | KOH | 0.1 | 0.1 | 0.1 | 0.1 | 0.1 | 0.1 | 0.1 | 0.1 | 0.1 | 0.1 |
| | | Glycine | 0.15 | 0.15 | 0.15 | 0.15 | 0.15 | 0.15 | 0.15 | 0.15 | 0.15 | 0.15 |
| | Defoamer | Silicone | 0.1 | 0.1 | 0.1 | 0.1 | 0.1 | 0.1 | 0.1 | 0.1 | 0.1 | 0.1 |
| | Water | | Residue | Residue | Residue | Residue | Residue | Residue | Residue | Residue | Residue | Residue |
| Removal rate (nm/min) | | | 182 | 2116 | 2176 | 2392 | 169 | 172 | 96 | 114 | 132 | 2156 |
| pH of polishing slurry | | | 10.4 | 9.7 | 9.7 | 9.6 | 10.4 | 10.3 | 9.6 | 9.5 | 9.5 | 9.6 |

It is evident from the results shown in Tables 1 and 2 that the polishing slurry of each of Examples produces a high removal rate for the polishing object including a resin.

The invention claimed is:

1. A polishing slurry for polishing a polishing object including a resin, wherein
   the polishing slurry comprises alumina abrasives and silica abrasives,
   the silica abrasives comprise aggregate particles composed of a plurality of primary particles of colloidal silica,
   an average particle size of the primary particles of colloidal silica is smaller than a median size of the alumina abrasives,
   a median size of the alumina abrasives is 300 nm or less, and a median size of the silica abrasives is 100 nm or more.

2. The polishing slurry according to claim 1, having a pH of 7.0 or more and 12.0 or less.

* * * * *